United States Patent
Sorensen et al.

(10) Patent No.: US 8,698,496 B2
(45) Date of Patent: Apr. 15, 2014

(54) METHOD FOR TWO-DIMENSIONAL CORRELATION MAGNETIC RESONANCE SPECTROSCOPY

(75) Inventors: Alma Gregory Sorensen, Belmont, MA (US); Ovidiu Cristian Andronesi, Melrose, MA (US); Carolyn Mountford, East Ryde (AU); Saadallah Ramadan, Bexley (AU); Borjan Aleksandar Gagoski, Cambridge, MA (US); Elfar Adalsteinsson, Belmont, MA (US)

(73) Assignees: The General Hospital Corporation, Boston, MA (US); Massachusetts Institute of Technology, Cambridge, MA (US); The Brigham and Women's Hospital, Boston, MA (US)

( * ) Notice: Subject to any disclaimer, the term of this patent is extended or adjusted under 35 U.S.C. 154(b) by 385 days.

(21) Appl. No.: 13/237,799

(22) Filed: Sep. 20, 2011

(65) Prior Publication Data
US 2012/0146639 A1 Jun. 14, 2012

Related U.S. Application Data

(60) Provisional application No. 61/403,714, filed on Sep. 20, 2010.

(51) Int. Cl.
*G01V 3/00* (2006.01)

(52) U.S. Cl.
USPC .................................. 324/309; 324/307

(58) Field of Classification Search
USPC ..................... 324/300–322; 600/407–445
See application file for complete search history.

(56) References Cited

U.S. PATENT DOCUMENTS

| | | | |
|---|---|---|---|
| 5,077,524 A * | 12/1991 | Hurd et al. | 324/318 |
| 7,105,186 B2 * | 9/2006 | Arntzen et al. | 424/757 |
| 7,179,608 B2 * | 2/2007 | O'Reilly et al. | 435/7.1 |
| 7,573,264 B2 * | 8/2009 | Xu et al. | 324/304 |
| 7,920,972 B2 * | 4/2011 | Szyperski et al. | 702/27 |
| 8,150,634 B1 * | 4/2012 | Constantine et al. | 702/20 |

* cited by examiner

*Primary Examiner* — Brij Shrivastav
(74) *Attorney, Agent, or Firm* — Quarles & Brady, LLP

(57) ABSTRACT

Methods for low-power in vivo localized multi-dimensional correlated magnetic resonance spectroscopy ("MRS") are provided. Low-power adiabaticity is achieved, generally, using gradient-modulated radio frequency pulses for localization and mixing. The provided pulse sequences also provide a mechanism for longitudinal mixing, which significantly increases the efficiency of magnetization transfer and thereby increases signal-to-noise ratio.

20 Claims, 8 Drawing Sheets

US 8,698,496 B2

METHOD FOR TWO-DIMENSIONAL CORRELATION MAGNETIC RESONANCE SPECTROSCOPY

CROSS-REFERENCE TO RELATED APPLICATIONS

This application claims the benefit of U.S. Provisional Patent Application Ser. No. 61/403,714, filed on Sep. 20, 2010, and entitled "System and Method for In-Vivo Molecular Phenotyping Using Localized Multidimensional Adiabatic COSY and TOCSY."

STATEMENT REGARDING FEDERALLY SPONSORED RESEARCH

This invention was made with Government support under Grant No. EB007942 awarded by the National Institutes of Health. The Government has certain rights in this invention.

BACKGROUND OF THE INVENTION

The field of the invention is systems and methods for magnetic resonance imaging ("MRI"). More particularly, the invention relates to systems and methods for magnetic resonance spectroscopy and spectroscopic imaging.

Although two-dimensional or even higher dimensional nuclear magnetic resonance ("NMR") spectroscopy includes a wide range of well-established methods in chemistry and structural biology, through which a wealth of structural information can be obtained, the development of in vivo multi-dimensional MR spectroscopy ("MRS") lags behind. Here multi-dimensional spectroscopy refers to multiple spectral dimensions as opposed to multiple spatial dimensions. For in vitro applications, especially in the case of crowded biomolecular systems such as proteins or brain biopsies, multi-dimensional MRS methods are crucial for disentangling overlapped signals and obtaining unambiguous assignments and structural constraints. A similar situation exists in vivo, with many metabolites overlapping in a reduced chemical shift range. Although there are considerably less visible in vivo metabolites than there are amino acids in a protein, the overlapping may be as severe in vivo because of reduced chemical shift dispersion and lower spectral resolution. Hence, complex fitting routines have been developed to extract the metabolic information from one dimensional in vivo spectra.

Two dimensional in vivo MR spectroscopy could help in reliable assignment, quantification, and perhaps, identification of new metabolites. To date, despite early interest, the number of two-dimensional NMR experiments adapted for in vivo MRS has been limited. This is largely due to the challenges of in vivo MRS, such as restrictions on lower radio frequency ("RF") power deposition and specific absorption rate ("SAR"), reduced signal-to-noise ratio ("SNR") from the adapted methods, shorter acquisition times, and the hardware of the clinical scanners.

It would therefore be desirable to provide a method for performing two-dimensional MRS that can provide clinically relevant spectral information about a subject with adequately high levels of SNR while maintaining low levels SAR and RF power deposition.

SUMMARY OF THE INVENTION

The present invention overcomes the aforementioned drawbacks by providing a method for correlation magnetic resonance spectroscopy, in which low levels of specific absorption rate ("SAR") are produced by using low-power adiabatic radio frequency ("RF") pulses. Signal-to-noise ratio in the spectral data is improved by inducing longitudinal mixing during scalar coupling by bracketing the mixing period with appropriate designed RF pulses.

It is an aspect of the invention to provide a method for directing a magnetic resonance imaging ("MRI") system to sample k-space to acquire multi-dimensional spectral data. This may be achieved by directing the MRI system to perform a pulse sequence that causes the MRI system to apply an excitatory radio frequency ("RF") pulse; apply a series of gradient-modulated low-power adiabatic RF pulses to induce scalar coupling; apply before the series of gradient-modulated low-power adiabatic RF pulses and after the excitatory RF pulse, a first RF pulse; apply after the series of gradient-modulated low-power adiabatic RF pulses, a second RF pulse; apply before the first RF pulse and after the excitatory RF pulse, a first coherence transfer pathway ("CTP") gradient; and apply after the second RF pulse, a second CTP gradient. Multi-dimensional spectral data may then be acquired by sampling k-space following the second CTP gradient. The first and second RF pulses are configured to induce longitudinal mixing during the scalar coupling, thereby improving the SNR of the acquired multi-dimensional spectral data. Furthermore, the CTP gradients are configured to select a coherence transfer pathway.

It is another aspect of the invention to provide a method for producing a two-dimensional spectrum with a magnetic resonance spectroscopy (MRS) system. A radio frequency (RF) excitation pulse is applied with the MRS system, after which a composite pulse sequence is applied for mixing. The composite pulse sequence includes a series of gradient-modulated low-power adiabatic RF pulses, such as GOIA-W(16,4) gradient-modulated RF pulses. Additional RF pulses are before and after the composite pulse sequence to induce longitudinal magnetization transfer during the mixing period. Two-dimensional spectral data is then acquired following the composite pulse sequence, from which a two-dimensional spectrum is reconstructed.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
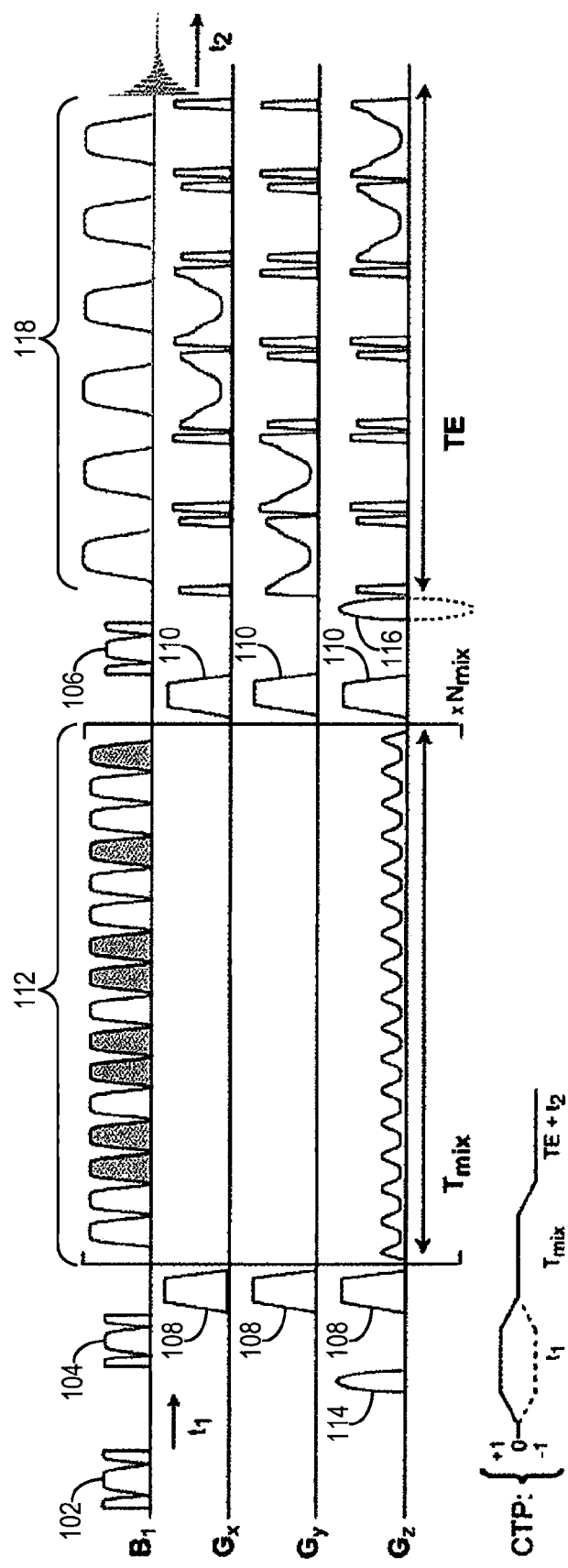
FIG. 1 is a pulse sequence diagram for an example of a fully adiabatic, two-dimensional TOCSY pulse sequence that uses localized adiabatic selective refocusing ("LASER") localization in accordance with an embodiment of the present invention.

Novel low-power adiabatic sequences are provided for in vivo localized two-dimensional correlated magnetic resonance spectroscopy ("MRS"), such as correlated spectroscopy ("COSY") and total correlated spectroscopy ("TOCSY"). The low power adiabaticity is achieved, generally, using gradient modulated, constant adiabaticity GOIA-W(16,4) pulses for localization. These GOIA-W(16,4) pulses provide accurate signal localization and an advantageous reduction in specific absorption rate ("SAR") for both mixing and localization. The provided pulse sequences also provide a mechanism for longitudinal mixing, which significantly increases the efficiency of TOCSY magnetization transfer.

While one-dimensional editing versions of in vivo TOCSY with adiabatic and nonadiabatic mixing have been reported before, two-dimensional adaptations have yet to be developed. The potential of two-dimensional TOCSY has not been fully exploited in vivo it requires a sustained train of radio frequency ("RF") pulses during TOCSY mixing, which results in intense specific absorption rate ("SAR") values that may exceed regulatory limits. The provided two-dimensional TOCSY sequences not only extend the number of spectral dimensions for TOCSY, but also provide significant adaptations that enable the improvement of magnetization transfer efficiency and allow two-dimensional scanning to be performed in similar amounts of time as one-dimensional scans, and with acceptable levels of SAR.

By way of example, the provided two-dimensional TOCSY and COSY pulse sequences may include the following general components to realize the aforementioned benefits. Gradient-modulated constant-adiabaticity pulses are used for localization. Examples of such pulses include GOIA-W(16,4) pulses. Additionally, gradient-modulated constant-adiabaticity pulses may also be used for TOCSY mixing. Moreover, a z-filter may be used to enable longitudinal TOCSY mixing and magnetization transfer between coupled spins. GOIA-W(16,4) pulses are favorable for the aforementioned applications because they require lower $B_1$ field amplitudes, which reduces power deposition, or specific absorption rate ("SAR"), during localization, TOCSY mixing, or both. The GOIA-W(16,4) pulses also provide the benefit of allowing for a shortened repetition time ("TR") period.

Compared to other methods, such as two-dimensional COSY or two-dimensional J-resolved spectroscopy, two-dimensional TOCSY provides more information because it reveals the full connectivity of a spin network and is, therefore, a desirable method to be made practical. For example, two-dimensional COSY contains information only about the direct scalar coupled spins, whereas two-dimensional TOCSY provides correlations for both direct and indirect coupled spins via relayed transfer. This information is useful because in some cases metabolites might have pairs of neighboring spins with similar chemical shifts. In the case of two-dimensional J-resolved spectroscopy, the indirect frequency dimension, which measures the scalar couplings, has a very limited range compared to the range of chemical shift available in the same frequency dimension of two-dimensional TOCSY or COSY experiments. Moreover, the scalar couplings do not change with increasing magnetic $B_0$ field, whereas the chemical shifts increase linearly with the $B_0$ field, so the benefit of high magnetic fields cannot be fully realized in two-dimensional J-resolved spectroscopy.

Before discussing the particular pulse sequences, a further discussion of TOCSY is provided. For the purpose of in vivo MRS, editing pulses are generally spatially nonselective and are applied on the entire imaged object. Similarly, in previous examples of one-dimensional edited TOCSY experiments, mixing is performed in a spatially nonselective manner. With the provided method of two-dimensional TOCSY, however, the ability of gradient modulation to reduce the $B_1$ amplitude and shorten the duration of adiabatic pulses for increased bandwidths is exploited to overcome these drawbacks.

The efficiency of a particular TOCSY mixing scheme can be understood through the buildup curves of magnetization transfer between scalar coupled spins that form a simple two spin system are governed by the following Hamiltonian:

$$\hat{H}(t) = -\Omega_1 \hat{I}_{z,1} - \Omega_2 \hat{I}_{z,2} + J(\hat{I}_{x,1}\hat{I}_{x,2} + \hat{I}_{y,1}\hat{I}_{y,2} + \hat{I}_{z,1}\hat{I}_{z,2}) + \sum_{k=1}^{N_p} \gamma(B_{1,k}(t)(\hat{F}_x\cos(\phi_k(t)) + \hat{F}_y\sin(\phi_k(t))) + zG_k(t)\hat{F}_z); \quad (1)$$

where N is the number of gradient modulated adiabatic pulses in a train of such pulses used for mixing; $B_{1,k}(t)$ is the amplitude modulation of the adiabatic pulses; $\phi_k(t)$ is the phase modulation of the adiabatic pulses; $G_k(t)$ is the gradient modulation of the adiabatic pulses; $\Omega_n$ (n=1, 2) and J represent the chemical shifts and the scalar coupling, respectively; $\hat{I}_{\alpha,n}$ ($\alpha$=x, y, z; n=1, 2) denote the individual spin operators; and $\hat{F}_\alpha$ ($\alpha$=x, y, z) denote the total spin system operators, in which $\hat{F}_\alpha=\hat{I}_{\alpha,1}+\hat{I}_{\alpha,2}$. In the case of most mobile metabolites, the influence of anisotropic interactions such as chemical shielding anisotropy and dipolar couplings on the coherent evolution of the spin system are neglected; however, these interactions are important for relaxation mechanisms, as will be discussed later.

RF pulses with a constant adiabatic factor, Q, can be obtained if the modulation functions noted above fulfill the following condition:

$$\phi_k(t) = 2\pi \frac{1}{Q} \int\limits_0^t \left( G_k(t) \int\limits_0^\tau \frac{\gamma B_{1,k}(\tau')}{G_k(\tau')} d\tau' - \omega_c \right) d\tau + \phi_k(0); \quad (2)$$

where $\omega_c$ is the center sweep frequency and $\phi_k(0)$ represents the initial phase of the pulse. By way of example, gradient offset independent adiabaticity ("GOIA") wideband, uniform rate, and smooth transition ("WURST") adiabatic pulses may be used. More particularly, a GOIA adiabatic pulse may employ a WURST-16 function for $B_1(t)$ modulation and a WURST-4 function for G(t) modulation. Collectively, such a pulse may be referred to as a GOIA-W(16,4) pulse. It is noted that WURST modulation may be defined as:

$$A(t)=A_0(1|\sin(\beta t)|^n); \quad (3)$$

where $A_0$ is the amplitude of the modulation; $-\pi/2 < \beta t < \pi/2$; and n is a parameter that controls the rounding-off of the waveform edges, with larger values of n resulting in less rounding-off. WURST functions are commonly reported with respect to the parameter, n, as "WURST-n" pulses. More particularly, GOIA-W(16,4) pulses may have the following RF pulse shape:

$$B_{1,n}(t) = B_{1,max}\left(1 - \left|\sin\left(\frac{\pi}{2}\left(\frac{2t}{T_p} - 1\right)\right)\right|^n\right); \quad (4)$$

and the following gradient pulse shape:

$$G_m = G_{max}\left((1-f) + f\left|\sin\left(\frac{\pi}{2}\left(\frac{2t}{T_p} - 1\right)\right)\right|^m\right); \quad (5)$$

where n=16, m=4, $T_p$ is the pulse duration, and f is selected as, for example, f=0.9.

To deliver the adiabatic pulses for mixing, it may be advantageous to utilize an MLEV scheme, such as an MLEV-16 scheme. For an MLEV-16 scheme, the initial phase, $\phi_k(0)$, in Eqn. (2) may equal zero. An MLEV scheme is a composite pulse sequence. By way of example, an MLEV-16 scheme is as follows:

$$RRrr-rRRr-rrRR-RrrR;$$

where
R=$90_x$-$180_y$-$90_x$; and
r=$90_{-x}$-$180_{-y}$-$90_{-x}$.

The buildup curves for magnetization transfer can be calculated through density matrix formalism and by detecting the magnetization transferred on the second spin, $\hat{I}_{z,2}$ or $\hat{I}_{x,2}$, for increasing mixing times. For such techniques, it is also assumed that initially only one of the spins has magnetization; that is, the initial density matrix $\hat{\sigma}(0)=\hat{I}_{z,1}$ for longitudinal mixing, or $\hat{\sigma}(0)=\hat{I}_{x,1}$ for transverse mixing.

Incoherent spin evolutions, such as, relaxation, during GOIA-W(16,4) pulses occur in the rotating frame of the effective field:

$$\omega_{eff}(t,z)=\sqrt{(\gamma B_1(t))^2+(\Delta\omega(t)+\gamma z G(t))^2}; \quad (6)$$

where $B_1(t)$ and $G(t)$ are modulated according to WURST-16 and (inverse) WURST-4 functions, respectively. The frequency modulation, $\Delta U$) is obtained from:

$$\Delta\omega(t) = \frac{G(t)}{Q}\int_0^t \frac{(\gamma B_1(\tau))^2}{G(\tau)}d\tau - \omega_c. \quad (7)$$

In the case of protons, the homonuclear dipolar interaction is the dominant relaxation mechanism, and considering the main pool of the free low-molecular-weight metabolites, the dynamics is in the fast regime with regard to the effective field; that is, $\omega_{eff}\tau_c \Box 1$, where $\tau_c$ is the correlation time, which is in the range of one picosecond to one nanosecond, and the effective field, $\omega_{eff}$, is in the range of 1-20 kilohertz. Under these conditions, the time-dependent and position-dependent (instantaneous) rotating frame relaxation rates for longitudinal mixing ($R_{1\rho,dd}$) and transverse mixing ($R_{2\rho,dd}$) can be approximated as:

$$R_{1\rho,dd}(t,z) \approx \quad (8)$$
$$\frac{3}{20}D^2\tau_c\left(3\sin^2\alpha(t,z) + \frac{2+3\sin^2\alpha(t,z)}{1+(\omega_0\tau_c)^2} + \frac{2+6\cos^2\alpha(t,z)}{1+4(\omega_0\tau_c)^2}\right);$$

and $$R_{2\rho,dd}(t,z) \approx \quad (9)$$
$$\frac{3}{80}D^2\tau_c\left(3 + 9\cos^3\alpha(t,z) + \frac{14+6\cos^2\alpha(t,z)}{1+(\omega_0\tau_c)^2} + \frac{8+12\sin^2\alpha(t,z)}{1+4(\omega_0\tau_c)^2}\right);$$

where $\alpha(t,z)$ is the polar angle of the effective field in the laboratory frame, D is the dipolar coupling constant, z is the molecule position along the slice direction, and $\omega_0=\gamma B_0$ is the Larmor frequency. The polar angle, $\alpha(t,z)$ may be given by:

$$\alpha(t,z) = \arctan\left(\frac{\gamma B_1(t)}{\Delta\omega(t) - \gamma z G(t)}\right); \quad (10)$$

and the dipolar constant, D, may be given by:

$$D = \frac{\hbar\mu_0\gamma^2}{4\pi r^3}; \quad (11)$$

where $\hbar$ is Planck's constant, $\mu_0$ is the magnetic permeability, $\gamma$ is the gyromagnetic ratio, and r is the intramolecular distance between the two spins.

From Eqns. (8) and (9), it can be shown that at any time, $R_{2\rho,dd}(t,z) > R_{1\rho,dd}(t,z)$; thus, during an entire MLEV-16 train of GOIA-W(16,4) pulses, the rotating frame relaxation for longitudinal mixing, assuming GOIA-W(16,4) pulses of duration $T_P$ and slice thickness $\Delta z$, may be given by:

$$R_{1\rho,dd}^{MLEV-16} = \frac{1}{16T_P} \cdot \frac{1}{\Delta z} \cdot \int_{-\Delta z/2}^{\Delta z/2} dz \int_0^{16T_P} R_{1\rho,dd}(t,z)dt; \quad (12)$$

is more favorable; that is, it is a smaller relaxation time, that rotating frame relaxation for transverse mixing, which may be given by:

$$R_{2\rho,dd}^{MLEV-16} = \frac{1}{16T_P} \cdot \frac{1}{\Delta z} \cdot \int_{-\Delta z/2}^{\Delta z/2} dz \int_0^{16T_P} R_{2\rho,dd}(t,z)dt. \quad (13)$$

Referring now to FIG. 1, an example of a fully adiabatic, two-dimensional TOCSY pulse sequence that uses localized adiabatic selective refocusing ("LASER") localization in accordance with an embodiment of the present invention is illustrated. The pulse sequence includes a radio frequency ("RF") excitation pulse 102. Optionally, water suppression may be performed with a WET scheme, as described by R. J. Ogg, et al., in "Wet, a T-1-insensitive and B-1-insensitive water-suppression method for in-vivo localized H-1-NMR spectroscopy," *J. Magn. Reson. Ser. B*, 1994; 104:1-10, which would precede the RF excitation pulse 102.

A gradient-enhanced z-filter composed of a first and second ninety degree adiabatic BIR-4 pulse 104, 106 and spoiler gradients 108, 110, brackets an MLEV-16 composite pulse 112 to perform transfer of longitudinal magnetization. Transfer of longitudinal magnetization by way of the RF pulses 104, 106 and spoiler gradients 108, 110 bracketing the composite pulse 112 produce longitudinal TOCSY mixing, which increases transfer efficiency and signal-to-noise ratio because, as described above, such a mixing scheme includes more favorable $T_{1\rho}$ effects rather than $T_{2\rho}$ effects. By way of example, the MLEV-16 composite pulse 112 concatenates individual GOIA-W(16,4) pulse shapes to eliminate gaps and can be repeated a number of times, $N_{mix}$, to achieve the desired mixing time. The relative phase of the GOIA-W(16,4) pulses changes according to the MLEV-16 scheme. For example, pulses that are grayed-out have an overall 180 degree phase shift compared to those that are not grayed-out. An example of a duration for the GOIA-W(16,4) pulses that provides a reduction in SAR is two milliseconds for a ten kilohertz bandwidth. The preferred gradient direction during MLEV-16 is selected for the gradient coil with the best performance. As noted, the composite pulse 112 includes a series of gradient-modulated, low-power adiabatic RF pulses. By way of example, these pulses are GOIA-W(16,4) pulses having RF pulse waveforms defined by Eqn. (4), which are modulated by magnetic field gradients having waveforms defined by (5). Sine-bell shaped gradients 114, 116 before and after the z-filtered MLEV-16 block select the coherence transfer pathway ("CTP") depicted underneath the sequence and may, therefore, be referred to as CTP gradients 114, 116.

An echo-antiecho acquisition can be performed if the phase of the first ninety degree pulse 104 of the z-filter is alternated simultaneously with the change in polarity of the second CTP gradient 116. The echo and antiecho free induction decay ("FID") signals are stored in an interleaved manner. Obtaining phase-sensitive spectra with such as echo-antiecho acquisition enables the full potential of two-dimensional spectra by obtaining the maximum possible sensitivity and spectral resolution.

A LASER localization module 118 follows the MLEV-16 block 112 and z-filter. The LASER localization module includes GOIA-W(16,4) pulses having, for example, a duration of 3.5 milliseconds. LASER localization is described in detail by M. Garwood and L. DelaBarre in "The Return of the Frequency Sweep: Designing Adiabatic Pulses for Contemporary NMR," *J. Magn. Reson.*, 2001; 153:155-177. If needed, a larger slice thickness can be used for the GOIA-W (16,4) pulses employed during TOCSY mixing compared to the size of the voxel selected by the localization scheme to decrease eddy currents during the long mixing time.

The evolution time, $t_1$, is incremented in successive scans and a minimum two step phase cycle involving the first excitation pulse and the receiver phase can be used to remove $t_1$ noise and axial peaks in both two-dimensional spectra. One-dimensional edited sequences can be obtained by replacing the first ninety degree BIR-4 pulse 104 with a selective Gaussian pulse. Each $t_1$ increment is stored once with the echo data and once with antiecho data, and data are processed accordingly. The two-dimensional spectrum is obtained upon Fourier transformation in both time dimensions.

Figure 2:
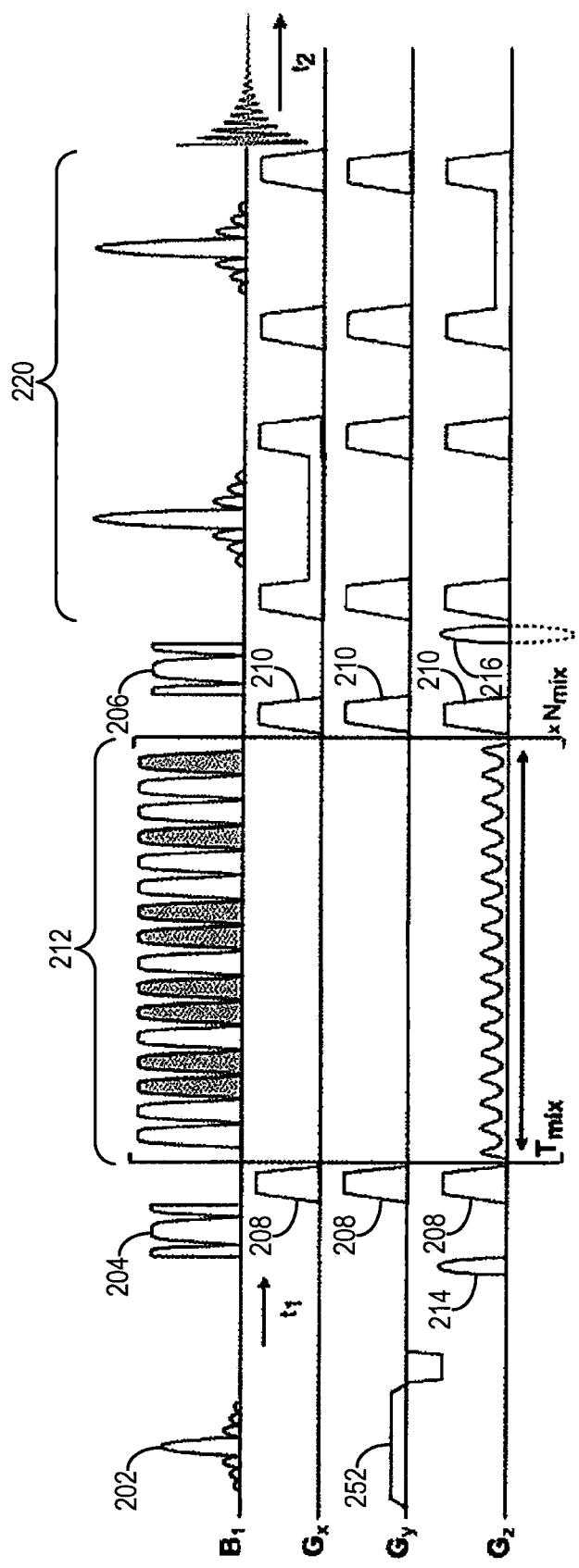
FIG. 2 is a pulse sequence diagram for an example of a semiadiabatic, two-dimensional TOCSY pulse sequence that uses PRESS localization in accordance with an embodiment of the present invention.

Referring now to FIG. 2, an example of a semiadiabatic, two-dimensional TOCSY pulse sequence that uses PRESS localization in accordance with an embodiment of the present invention is illustrated. This pulse sequence includes an RF excitation pulse 202 that is played out in the presence of a selective gradient 252. Like the preceding pulse sequence, an MLEV-16 composite pulse 212 is used for TOCSY mixing, and this composite pulse 212 is bracketed by adiabatic RF pulses 204, 206 and spoiler gradients 208, 210 to effectuate longitudinal magnetization transfer. Likewise, CTP gradients 214, 216 are applied as in the preceding pulse sequence for echo-antiecho acquisition. Here, a PRESS localization pulse sequence 220 is applied to spatially localize the acquired spectral data. Details of PRESS localization are described, for example, by P. A. Bottomley in "Spatial Localization in NMR-Spectroscopy In Vivo," *Ann. NY Acad. Sci.*, 1987; 508: 333-348.

Figure 3:
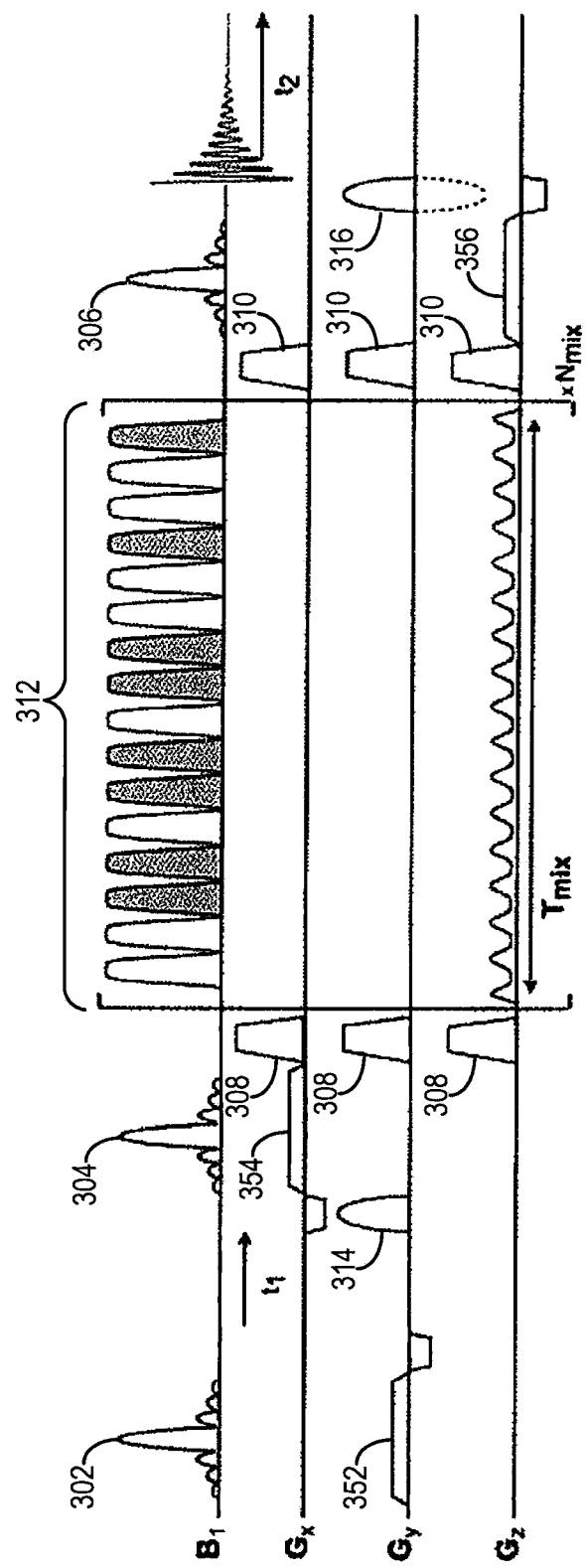
FIG. 3 is a pulse sequence diagram for an example of a semiadiabatic, two-dimensional TOCSY pulse sequence that uses STEAM localization in accordance with an embodiment of the present invention.

Referring now to FIG. 3, an example of a semiadiabatic, two-dimensional TOCSY pulse sequence that uses STEAM localization in accordance with an embodiment of the present invention is illustrated. This pulse sequence includes an RF excitation pulse 302 that is played out in the presence of a selective gradient 352. Like the preceding pulse sequence, an MLEV-16 composite pulse 312 is used for TOCSY mixing, and this composite pulse 312 is bracketed by RF pulses 304, 306 and spoiler gradients 308, 310 to effectuate longitudinal magnetization transfer. Likewise, CTP gradients 314, 316 are applied as in the preceding pulse sequence for echo-antiecho acquisition. Here, spatial localization is performed in accordance with STEAM localization techniques, which are described, for example, by J. Frahm, et al., in "Localized high-resolution Proton NMR-Spectroscopy using Stimulated Echoes—Initial Application to Human-Brain In Vivo," *Magn. Reson. Med.*, 1989; 9:79-93. STEAM localization lends itself naturally for longitudinal TOCSY mixing by inserting the MLEV-16 composite pulse 312 between the last two ninety degree RF pulses 304, 306. These two RF pulses are applied in the presence of selective gradients 354, 356. For STEAM localization, the last two ninety degree pulses 304, 306 can act also as the aforementioned z-filter.

Figure 4:
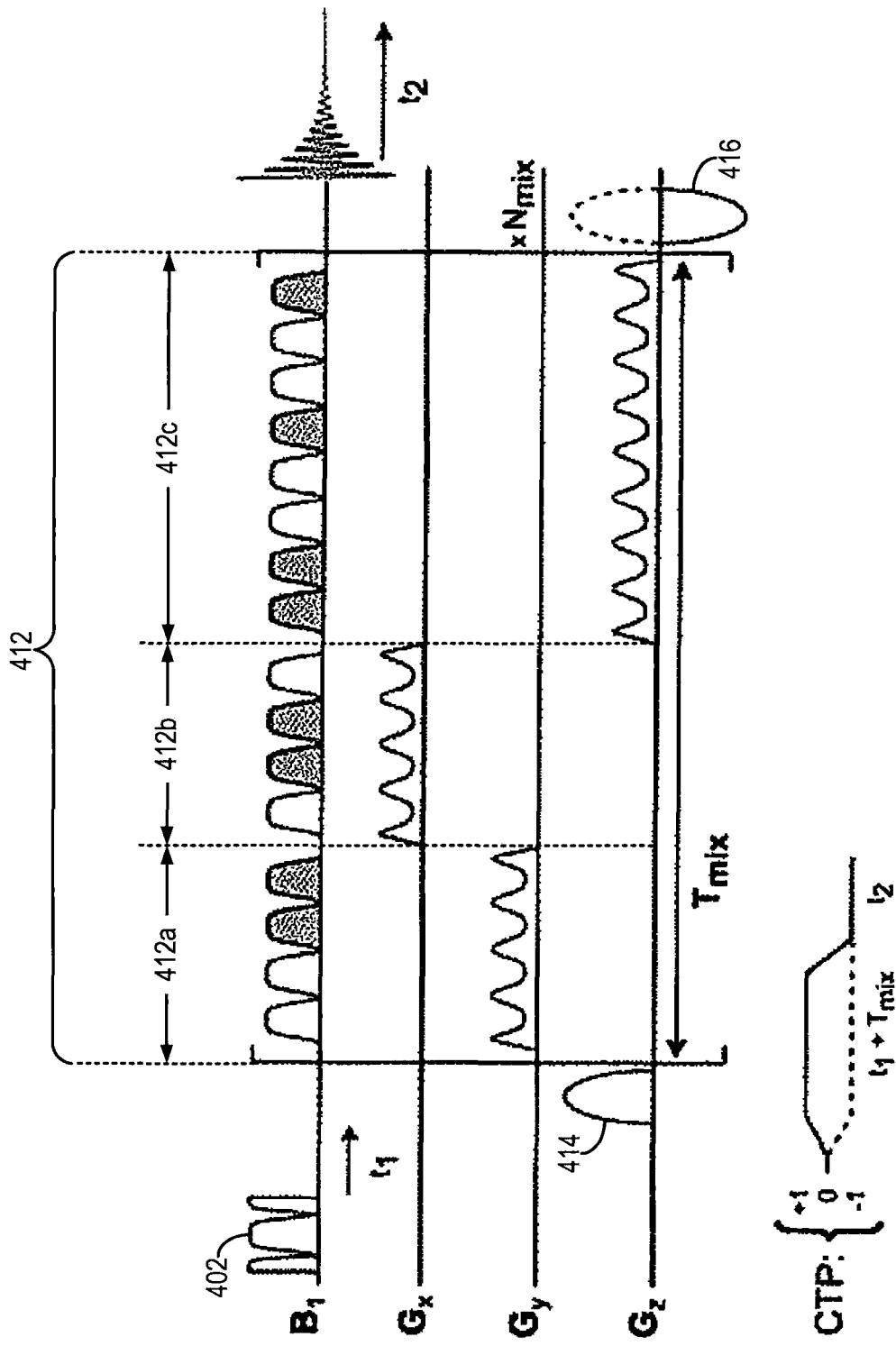
FIG. 4 is a pulse sequence diagram for an example of a pulse sequence that enables simultaneous localization and transverse TOCSY mixing.

Referring now to FIG. 4, an example of a pulse sequence that enables simultaneous localization and transverse TOCSY mixing is illustrated. A fully adiabatic sequence named two-dimensional LT-TOCSY is provided to perform simultaneous three-dimensional volume localization and transverse mixing. The pulse sequence includes an RF excitation pulse 402 and an MLEV-16, or other, composite pulse 412 bracketed by a first and second CTP gradient 414, 416.

To achieve the desired three-dimensional volume localization, the sixteen GOIA-W(16,4) pulses of the MLEV-16 composite pulse 412 are distributed in three groups: the first group 412a includes four pulses for the y-gradient direction, the second group 412b includes four pulses for the x-gradient direction, and the third group 412c includes eight pulses for the z-gradient direction. Two short gaps may be used for gradient ramp-up and ramp-down between the first and second groups 412a, 412b and the second and third groups 412b, 412c. Phase cycle and CTP gradients are similar with the previous sequences. This pulse sequence design has the advantage that it can significantly reduce SAR compared to other sequences.

Figure 5:
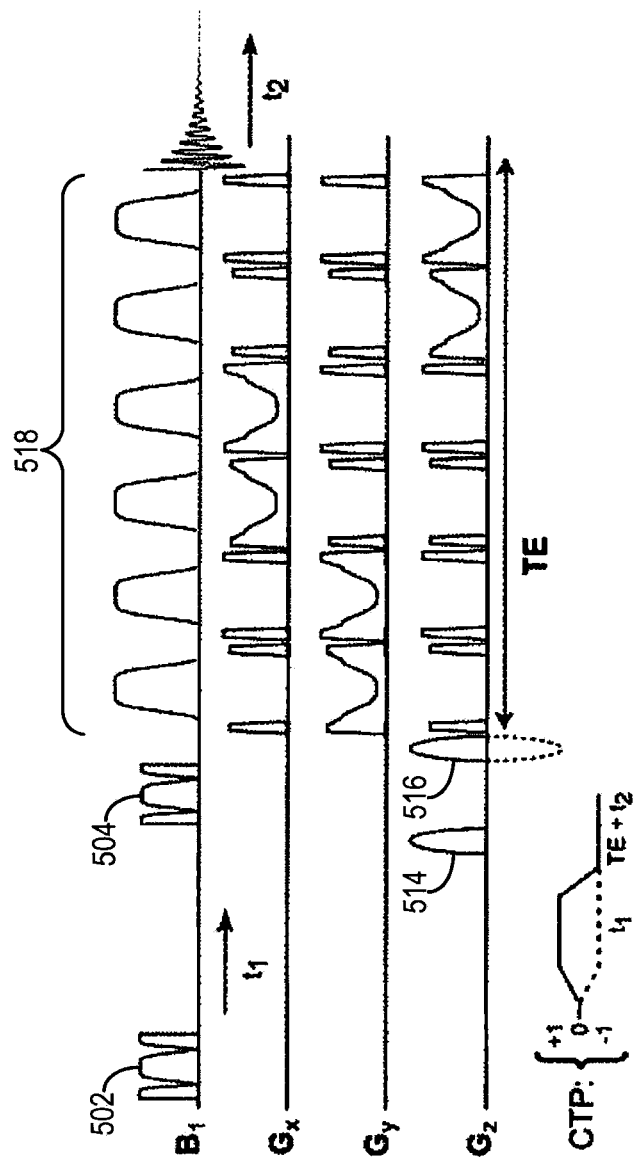
FIG. 5 is a pulse sequence diagram for an example of a fully adiabatic, two-dimensional COSY pulse sequence that uses LASER localization in accordance with an embodiment of the present invention.

Referring now to FIG. 5, an example of a fully adiabatic, two-dimensional COSY pulse sequence that uses LASER localization in accordance with an embodiment of the present invention is illustrated. The pulse sequence includes an RF excitation pulse 502 followed by the application of a ninety degree adiabatic BIR-4 pulse 504 that is bracketed by a first and second CTP gradient 514, 516. Following the application of the second CTP gradient 516, a LASER localization module 518 is performed. As described above, the polarity of the CTP gradients 514, 516 can be alternated for interleaved echo-antiecho acquisitions.

Figure 6:
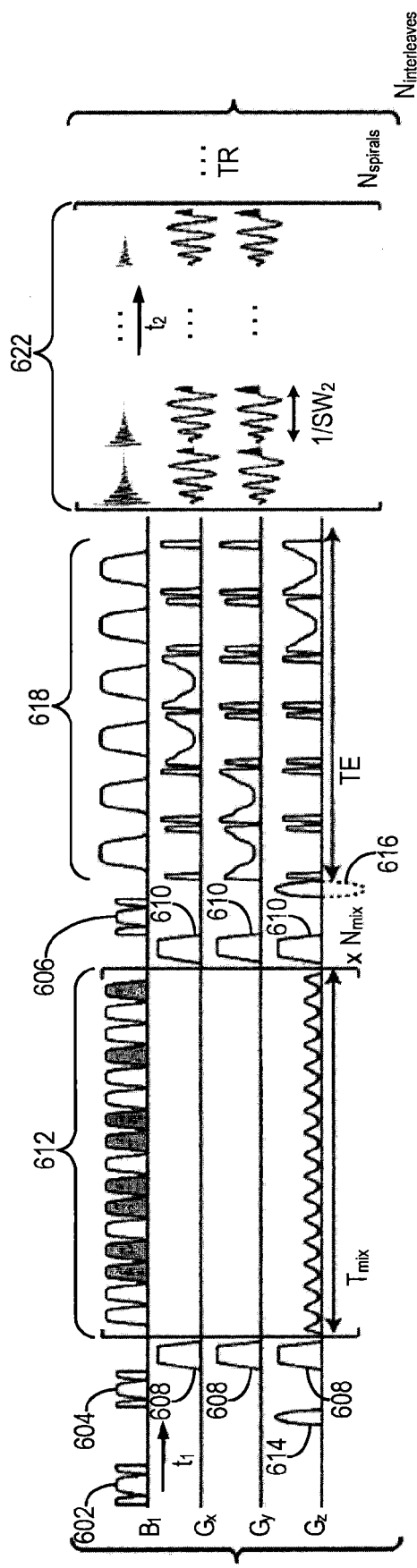
FIG. 6 is a pulse sequence diagram for an example of a fully adiabatic, two-dimensional TOCSY pulse sequence that uses LASER localization and a spiral acquisition scheme in accordance with an embodiment of the present invention.

Referring now to FIG. 6, an example of a fully adiabatic, two-dimensional TOCSY pulse sequence that uses LASER localization and a spiral acquisition scheme in accordance with an embodiment of the present invention is illustrated.

The pulse sequence includes an RF excitation pulse 602 followed by a composite pulse 612, such as an MLEV-16 pulse. The composite pulse 612 is bracketed by RF pulses 604, 606 and spoiler gradients 608, 610 to produce longitudinal magnetization transfer. Likewise, the composite pulse 612 is bracketed by CTP gradients 614, 616 for coherence transfer pathway selection and optional echo-antiecho acquisition techniques, as described above. Following the composite pulse 612, a LASER localization pulse sequence 618 is applied, after which a spiral data acquisition sequence 622 is performed.

Such a pulse sequence enables correlation chemical shift imaging ("CSSI") to be performed. Constant-density spiral readout trajectories are used to simultaneously acquire two spatial dimensions and one spectral dimension in order to speed up data acquisition, while the second spectral dimension is encoded by consecutive time increments of $t_1$ evolution.

Pre-selection of a large volume of interest ("VOI") is obtained using slice-selective pulses that are applied in three orthogonal directions, such as in the case of PRESS, STEAM, and LASER localization techniques. Constant adiabaticity gradient modulated GOIA-W(16,4) pulses and LASER localization are advantageous for selecting the VOI because they provide precise localization with negligible chemical shift displacement error ("CSDE"), uniform flip angle excitation of the VOI, substantially no lipid contamination from subcutaneous fat, efficient mixing for scalar coupled spins over a large bandwidth, and reduced power deposition, resulting in reduced SAR.

CSDE is inversely proportional with the bandwidth of the slice-selective pulse; thus, increasing pulse bandwidth is effective in reducing CSDE. For conventional pulses, the bandwidth is limited by the maximum $B_1$ available; however, adiabatic pulses can obtain very large bandwidths when $B_1$ is limited. For example, GOIA-W(16,4) pulses can achieve 20 kHz bandwidth with only 18.7 µT maximum $B_1$ field amplitude. With a bandwidth of 20 kHz, a negligible two percent CSDE is obtained over 3.5 ppm proton chemical shift range at 3 T. By comparison, Mao refocusing pulses that are typically used in L-COSY can have up to thirty-eight percent CSDE over a 3.5 ppm proton chemical shift range at 3 T.

By design, GOIA pulses also have the advantage of a constant adiabatic factor over the entire bandwidth, while for conventional adiabatic pulses the adiabatic factor decreases away from center frequency. In addition to minimizing CSDE, GOIA-W(16,4) pulses provide optimal flip angles uniformly across large volumes-of-interest and spectral bandwidth, which is important for enabling efficient coherence transfer among scalar coupled spins.

Spiral spectroscopic imaging trades off spatial resolution with spectral bandwidth. Given spatial resolution requirements and physical limitations of gradient hardware on clinical scanners, it is very difficult to encode all spatial information with a spiral trajectory of length less than, or equal to the inverse of the spectral window. To overcome this drawback, interleaved spiral trajectories, $N_{interleaves}=N_a \times N_t$, which typically are decomposed into so-called angular, $N_a$, and temporal, $N_t$, interleaves, are utilized. The desired field-of-view ("FOV"), spatial resolution, and spectral bandwidth are obtained by modifying the duration of each spiral lobe concomitant with the number of angular interleaves, $N_a$, for FOV and spatial resolution, and the number of temporal interleaves, $N_t$, for spectral bandwidth. Angular interleaving decomposes the $k_x$, $k_y$ space into sparser $N_a$ spiral trajectories rotated by $\theta_n=2\pi \cdot (n-1)/N_a$, $n=1, \ldots, N_a$. For temporal interleaving, the readout gradients start $(n-1)\Delta t_2$ ($n=1, \ldots,$ $N_t$) seconds later relative to acquisition. The choice of temporal or angular interleaves is made such that acquisition time $(N_a \cdot N_t \cdot TR)$ is minimized A rewinder gradient is used after each spiral gradient to return to the origin of k-space, the duration of the rewinder being fixed to the shortest value.

To reconstruct spectra from the data acquired with the foregoing pulse sequence, the data may be gridded on a Cartesian grid using, for example, a Kaiser-Bessel kernel, prior to Fourier transformation. When multiple receiver coils are used, data from the different coil elements may be combined using complex coil weights, such as those that may be obtained from a prescan.

Figure 7:
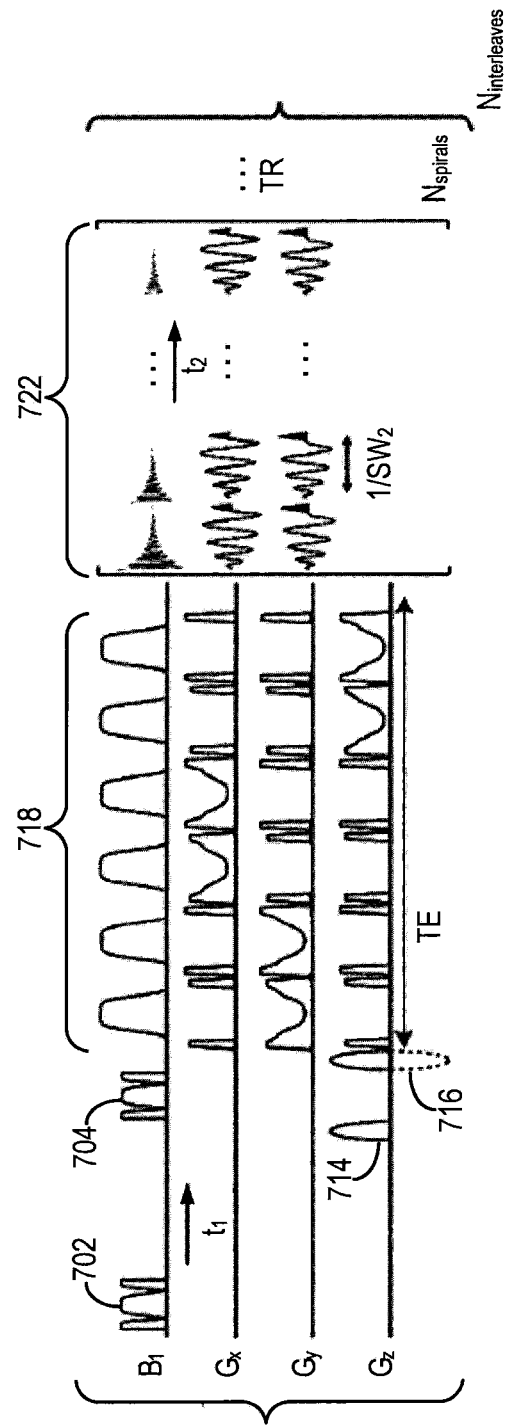
FIG. 7 is a pulse sequence diagram for an example of a fully adiabatic, two-dimensional COSY pulse sequence that uses LASER localization and a spiral acquisition scheme in accordance with an embodiment of the present invention.

Referring now to FIG. 7, an example of a fully adiabatic, two-dimensional COSY pulse sequence that uses LASER localization and a spiral acquisition scheme in accordance with an embodiment of the present invention is illustrated. The pulse sequence includes an RF excitation pulse 702 followed by the application of a ninety degree adiabatic BIR-4 pulse 704 that is bracketed by a first and second CTP gradient 714, 716. Following the application of the second CTP gradient 716, a LASER localization module 718 is performed. As described above, the polarity of the CTP gradients 714, 716 can be alternated for interleaved echo-antiecho acquisitions. After the LASER localization module, a spiral data acquisition sequence 722 is performed.

Figure 8:
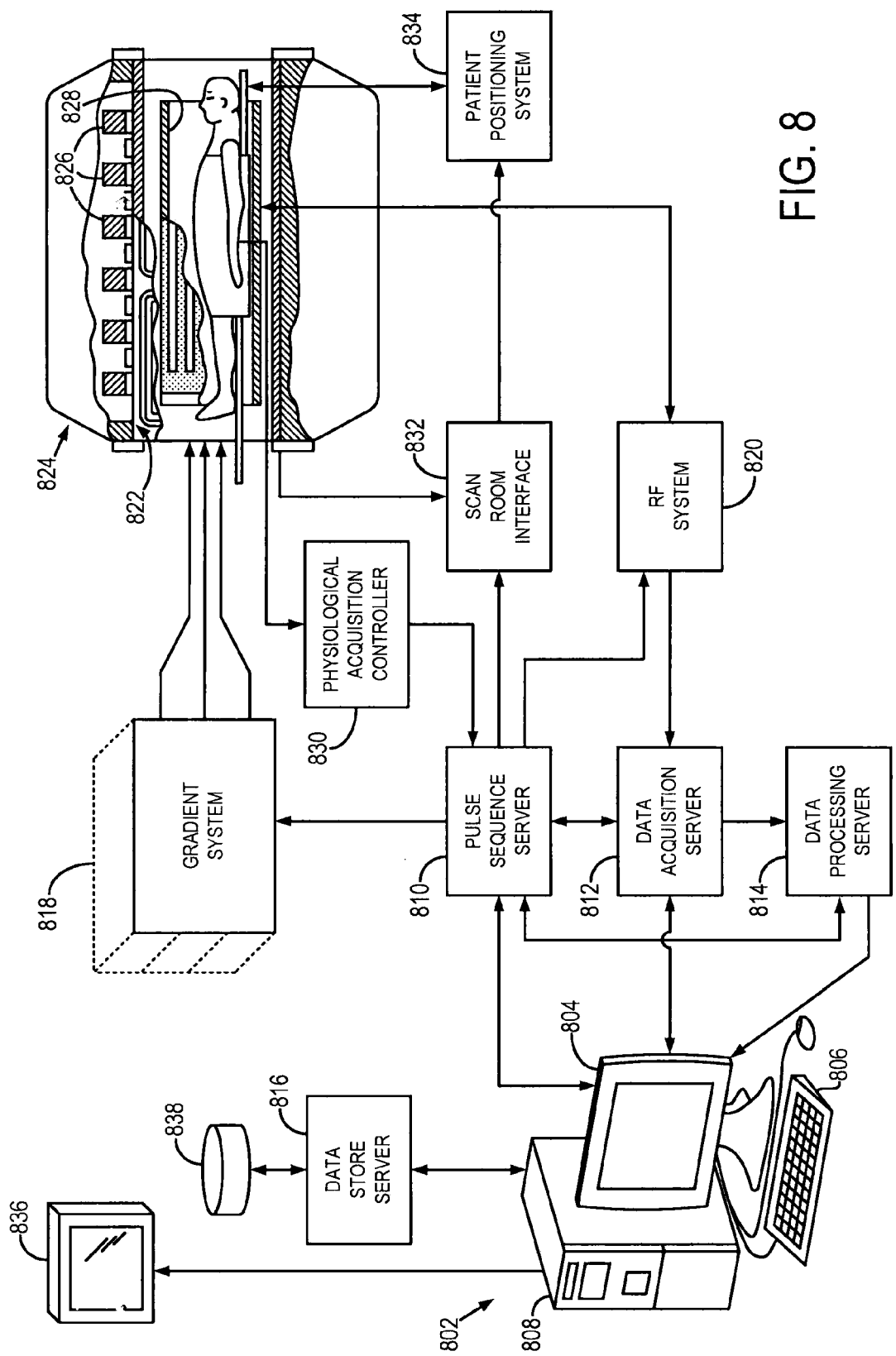
FIG. 8 is a block diagram of an example of a magnetic resonance imaging ("MRI") system.

Referring particularly now to FIG. 8, an exemplary magnetic resonance imaging ("MRI") system 800 is illustrated. The MRI system 800 includes a workstation 802 having a display 804 and a keyboard 806. The workstation 802 includes a processor 808, such as a commercially available programmable machine running a commercially available operating system. The workstation 802 provides the operator interface that enables scan prescriptions to be entered into the MRI system 800. The workstation 802 is coupled to four servers: a pulse sequence server 810; a data acquisition server 812; a data processing server 814; and a data store server 816. The workstation 802 and each server 810, 812, 814, and 816 are connected to communicate with each other.

The pulse sequence server 810 functions in response to instructions downloaded from the workstation 802 to operate a gradient system 818 and a radiofrequency ("RF") system 820. Gradient waveforms necessary to perform the prescribed scan are produced and applied to the gradient system 818, which excites gradient coils in an assembly 822 to produce the magnetic field gradients $G_x$, $G_y$, and $G_z$ used for position encoding MR signals. The gradient coil assembly 822 forms part of a magnet assembly 824 that includes a polarizing magnet 826 and a whole-body RF coil 828.

RF excitation waveforms are applied to the RF coil 828, or a separate local coil (not shown in FIG. 8), by the RF system 820 to perform the prescribed magnetic resonance pulse sequence. Responsive MR signals detected by the RF coil 828, or a separate local coil (not shown in FIG. 8), are received by the RF system 820, amplified, demodulated, filtered, and digitized under direction of commands produced by the pulse sequence server 810. The RF system 820 includes an RF transmitter for producing a wide variety of RF pulses used in MR pulse sequences. The RF transmitter is responsive to the scan prescription and direction from the pulse sequence server 810 to produce RF pulses of the desired frequency, phase, and pulse amplitude waveform. The generated RF pulses may be applied to the whole body RF coil 828 or to one or more local coils or coil arrays (not shown in FIG. 8).

The RF system 820 also includes one or more RF receiver channels. Each RF receiver channel includes an RF amplifier that amplifies the MR signal received by the coil 828 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2};\tag{14}$$

and the phase of the received MR signal may also be determined:

$$\varphi = \tan^{-1}\left(\frac{Q}{I}\right).\tag{15}$$

The pulse sequence server 810 also optionally receives patient data from a physiological acquisition controller 830. The controller 830 receives signals from a number of different sensors connected to the patient, such as electrocardiograph ("ECG") signals from electrodes, or respiratory signals from a bellows or other respiratory monitoring device. Such signals are typically used by the pulse sequence server 810 to synchronize, or "gate," the performance of the scan with the subject's heart beat or respiration.

The pulse sequence server 810 also connects to a scan room interface circuit 832 that receives signals from various sensors associated with the condition of the patient and the magnet system. It is also through the scan room interface circuit 832 that a patient positioning system 834 receives commands to move the patient to desired positions during the scan.

The digitized MR signal samples produced by the RF system 820 are received by the data acquisition server 812. The data acquisition server 812 operates in response to instructions downloaded from the workstation 802 to receive the real-time MR data and provide buffer storage, such that no data is lost by data overrun. In some scans, the data acquisition server 812 does little more than pass the acquired MR data to the data processor server 814. However, in scans that require information derived from acquired MR data to control the further performance of the scan, the data acquisition server 812 is programmed to produce such information and convey it to the pulse sequence server 810. For example, during prescans, MR data is acquired and used to calibrate the pulse sequence performed by the pulse sequence server 810. Also, navigator signals may be acquired during a scan and used to adjust the operating parameters of the RF system 820 or the gradient system 818, or to control the view order in which k-space is sampled.

The data processing server 814 receives MR data from the data acquisition server 812 and processes it in accordance with instructions downloaded from the workstation 802. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 814 are conveyed back to the workstation 802 where they are stored. Real-time images are stored in a data base memory cache (not shown in FIG. 8), from which they may be output to operator display 812 or a display 836 that is located near the magnet assembly 824 for use by attending physicians. Batch mode images or selected real time images are stored in a host database on disc storage 838. When such images have been reconstructed and transferred to storage, the data processing server 814 notifies the data store server 816 on the workstation 802. The workstation 802 may be used by an operator to archive the images, produce films, or send the images via a network to other facilities.

Pulse sequences that enable localized in vivo low-power adiabatic TOCSY and COSY are provided. The sequences allow improved magnetization transfer efficiency, precise localization, and reduced SAR. Importantly, these sequences can be run in a standard clinical environment with a feasible acquisition time.

The present invention has been described in terms of one or more preferred embodiments, and it should be appreciated that many equivalents, alternatives, variations, and modifications, aside from those expressly stated, are possible and within the scope of the invention. For example, mixing schemes other than MLEV-16, such as DIPSI-2, could be implemented. With DIPSI-2, the need for arbitrary flip angles would make the use of GOIA pulses difficult, although BIR-4 pulses could be used at the expense of some increase in SAR. Likewise, the provided pulse sequences can be run as exchange spectroscopy experiments if the $B_1$ field is set to zero during mixing time. Moreover, the provided pulse sequences can also be run in a one-dimensional edited mode is desired. It should also be appreciated that while described with respect to two spectral dimensions, the foregoing pulse sequences may also be readily adapted to provide multi-dimensional spectral information.

The invention claimed is:

1. A method for directing a magnetic resonance imaging (MRI) system to sample k-space to acquire multi-dimensional spectral data, the steps of the method comprising:
    directing the MRI system to perform a pulse sequence that causes the MRI system to:
        apply an excitatory radio frequency (RF) pulse;
        apply a series of gradient-modulated low-power adiabatic RF pulses during which scalar coupling occurs;
        apply before the series of gradient-modulated low-power adiabatic RF pulses and after the excitatory RF pulse, a first RF pulse;
        apply after the series of gradient-modulated low-power adiabatic RF pulses, a second RF pulse;
        apply before the first RF pulse and after the excitatory RF pulse, a first coherence transfer pathway ("CTP") gradient;
        apply after the second RF pulse, a second CTP gradient;
        acquire multi-dimensional spectral data by sampling k-space following the second CTP gradient; and
    wherein the first and second RF pulses are employed to produce longitudinal mixing during the scalar coupling, and the first and second CTP gradients are employed to select a coherence transfer pathway.

2. The method as recited in claim 1 in which the polarity of the second CTP gradient is alternated such that an echo-antiecho acquisition is performed.

3. The method as recited in claim 2 in which the polarity of the first RF pulse is alternated relative to the polarity of the second CTP gradient to facilitate the echo-antiecho acquisition.

4. The method as recited in claim 1 in which the series of gradient-modulated low-power adiabatic pulses include GOIA-W(16,4) gradient-modulated RF pulses.

5. The method as recited in claim 1 in which the first RF pulse is a first adiabatic RF pulse and the second RF pulse is a second adiabatic RF pulse.

6. The method as recited in claim 5 in which the first and second adiabatic RF pulses include BIR-4 pulses.

7. The method as recited in claim 1 in which the excitatory RF pulse is a BIR-4 pulse.

8. The method as recited in claim 1 in which the pulse sequence further causes the MRI system to perform at least one of a LASER localization, a PRESS localization, and a STEAM localization technique.

9. The method as recited in claim 1 in which a volume-of-interest from which the multi-spectral data is acquired is spatially localized in three-dimensions by the series of gradient-modulated low-power adiabatic RF pulses, and in which the series of gradient-modulated low-power adiabatic RF pulses include a first set of gradient-modulated low-power adiabatic RF pulses applied concurrently with gradients along an x-gradient axis, a second set of gradient-modulated low-power adiabatic RF pulses applied concurrently with gradients along a y-gradient axis, and a third set of gradient-modulated low-power adiabatic RF pulses applied concurrently with gradients along a z-gradient axis.

10. The method as recited in claim 9 in which the series of gradient-modulated low-power adiabatic RF pulses includes an MLEV-16 composite pulse.

11. The method as recited in claim 10 in which the first set of gradient-modulated low-power adiabatic RF pulses includes four gradient-modulated low-power adiabatic RF pulses, the second set of gradient-modulated low-power adiabatic RF pulses includes four gradient-modulated low-power adiabatic RF pulses, and the third set of gradient-modulated low-power adiabatic RF pulses includes eight gradient-modulated low-power adiabatic RF pulses.

12. The method as recited in claim 1 in which the multi-dimensional spectral data is acquired using a constant-density spiral acquisition scheme.

13. The method as recited in claim 1 in which the pulse sequence further causes the MRI system to apply a first set of spoiler gradients after the first RF pulse and before the series of gradient-modulated low-power adiabatic RF pulses and to apply a second set of spoiler gradients after the series of gradient-modulated low-power adiabatic RF pulses and before the second RF pulse.

14. The method as recited in claim 1 in which the series of gradient-modulated low-power adiabatic RF pulses includes an MLEV-16 composite pulse.

15. A method for producing a two-dimensional spectrum with a magnetic resonance spectroscopy (MRS) system, the steps of the method comprising:
  a) applying a radio frequency (RF) pulse with the MRS system;
  b) applying a composite pulse sequence for mixing, the composite pulse sequence including a series of gradient-modulated low-power adiabatic RF pulses;
  c) applying RF pulses before and after the composite pulse sequence to induce longitudinal magnetization transfer;
  d) acquiring two-dimensional spectral data following the composite pulse sequence; and
  e) reconstructing from the two-dimensional spectral data, a two-dimensional spectrum.

16. The method as recited in claim 15 in which the MRS system includes a magnetic resonance imaging (MRI) system.

17. The method as recited in claim 15 in which the composite pulse sequence is an MLEV-16 pulse sequence.

18. The method as recited in claim 15 further comprising applying a localization pulse sequence before acquiring the two-dimensional spectral data, the localization pulse sequence including at least one of a LASER pulse sequence, a PRESS pulse sequence, and a STEAM pulse sequence.

19. The method as recited in claim 15 in which the composite pulse sequence is configured to localize a volume-of-interest by including a first set of gradient-modulated low-power adiabatic RF pulses applied concurrently with gradients along an x-gradient axis, a second set of gradient-modulated low-power adiabatic RF pulses applied concurrently with gradients along a y-gradient axis, and a third set of gradient-modulated low-power adiabatic RF pulses applied concurrently with gradients along a z-gradient axis.

20. The method as recited in claim 15 further comprising applying a coherence transfer pathway gradient before and after the composite pulse sequence to select a coherence transfer pathway.

* * * * *

UNITED STATES PATENT AND TRADEMARK OFFICE
CERTIFICATE OF CORRECTION

PATENT NO. : 8,698,496 B2  
APPLICATION NO. : 13/237799  
DATED : April 15, 2014  
INVENTOR(S) : Alma Gregory Sorensen et al.

Page 1 of 1

It is certified that error appears in the above-identified patent and that said Letters Patent is hereby corrected as shown below:

In the Specification

Column 5, line 49 "AU" should be -- $\Delta\omega$ --

Column 5, line 61 "□" should be -- $\ll$ --

Signed and Sealed this  
Twenty-sixth Day of August, 2014

Michelle K. Lee  
*Deputy Director of the United States Patent and Trademark Office*